United States Patent
Lhullier et al.

(10) Patent No.: US 10,475,594 B2
(45) Date of Patent: Nov. 12, 2019

(54) ELECTRONIC DEVICE COMPRISING NANOGAP ELECTRODES AND NANOPARTICLE

(71) Applicants: NEXDOT, Paris (FR); FONDS DE L'ESPCI—GEORGES CHARPAK, Paris (FR)

(72) Inventors: Emmanuel Lhullier, Paris (FR); Benoit Dubertret, Paris (FR)

(73) Assignees: NEXDOT, Paris (FR); FONDS DE L'ESPCI—GEORGES CHARPAK, Paris (FR)

(*) Notice: Subject to any disclaimer, the term of this patent is extended or adjusted under 35 U.S.C. 154(b) by 0 days.

(21) Appl. No.: 14/258,245

(22) Filed: Apr. 22, 2014

(65) Prior Publication Data

US 2015/0303256 A1    Oct. 22, 2015

(51) Int. Cl.
*H01G 9/20* (2006.01)
*H01L 21/02* (2006.01)
(Continued)

(52) U.S. Cl.
CPC .............. *H01G 9/205* (2013.01); *B82Y 10/00* (2013.01); *H01G 9/2054* (2013.01); *H01L 21/02551* (2013.01); *H01L 21/02568* (2013.01); *H01L 21/02601* (2013.01); *H01L 21/02628* (2013.01); *H01L 21/28* (2013.01); *H01L 29/0665* (2013.01); *H01L 29/0673* (2013.01); *H01L 29/22* (2013.01); *H01L 29/413* (2013.01);
(Continued)

(58) Field of Classification Search
None
See application file for complete search history.

(56) References Cited

U.S. PATENT DOCUMENTS

2002/0104762 A1* 8/2002 Stonas ................. B01J 13/0047
  205/118
2006/0292777 A1* 12/2006 Dunbar ............. H01L 21/02554
  438/197

(Continued)

FOREIGN PATENT DOCUMENTS

WO    2009143328    11/2009
WO    2012050533    4/2012
(Continued)

OTHER PUBLICATIONS

Park et al., "Fabrication of metallic electrodes with nanometer separation by electromigration", Applied Physics Letters, 1999, vol. 75, No. 2, pp. 301-303.
(Continued)

*Primary Examiner* — Steven B Gauthier
(74) *Attorney, Agent, or Firm* — Young & Thompson

(57) ABSTRACT

An electronic device includes a substrate and at least two electrodes spaced by a nanogap, wherein the at least two electrodes are bridged by at least one nanoparticle and wherein the at least one nanoparticle has an overlap area with the at least two electrodes higher than 2% of the area of the at least one nanoparticle. A method of manufacturing of the electronic device and the use of the electronic device in photodetector, transistor, phototransistor, optical modulator, electrical diode, photovoltaic cell or electroluminescent component are also described.

16 Claims, 6 Drawing Sheets

(51) Int. Cl.
  *B82Y 10/00* (2011.01)
  *H01L 29/06* (2006.01)
  *H01L 29/22* (2006.01)
  *H01L 21/28* (2006.01)
  *H01L 29/41* (2006.01)
  *H01L 31/0224* (2006.01)
  *H01L 51/52* (2006.01)
  *H01L 51/56* (2006.01)
  *H01L 33/06* (2010.01)
  *H01S 5/10* (2006.01)
  *H01L 31/112* (2006.01)

(52) U.S. Cl.
  CPC .. *H01L 31/022408* (2013.01); *H01L 51/5206* (2013.01); *H01L 51/5221* (2013.01); *H01L 51/56* (2013.01); *H01L 31/112* (2013.01); *H01L 33/06* (2013.01); *H01S 5/1067* (2013.01)

(56) References Cited

U.S. PATENT DOCUMENTS

| 2007/0128808 | A1* | 6/2007 | Choi | B82Y 10/00 |
| | | | | 438/270 |
| 2008/0108172 | A1 | 5/2008 | Xi et al. | |
| 2009/0291534 | A1* | 11/2009 | Li et al. | 438/151 |
| 2016/0336067 | A1* | 11/2016 | Bertin | H01L 29/861 |

FOREIGN PATENT DOCUMENTS

| WO | 2013170103 A1 | 11/2013 | |
| WO | WO 2013170103 A1 * | 11/2013 | H01M 6/045 |
| WO | WO-2013170103 A1 * | 11/2013 | H01M 6/045 |

OTHER PUBLICATIONS

Klein et al., "An approach to electrical studies of single nanocrystals", Applied Physics Letters, 1996, vol. 68, No. 18, pp. 2574-2576.
Zabet-Khosousi et al., "Charge transport in Nanoparticle Assemblies", Chemical Reviews, 2008, vol. 108, No. 10, pp. 4072-4124.
Liu et al., "Controllable nanogap fabrication on microchip by chronopotentiometry", Electrochimica Acta, 2005, vol. 50, No. 15, pp. 3041-3047.
Pedetti et al., "Optimized synthesis of CdTe Nanoplatelets and photoresponse of CdTe Nanoplatelets films", Chemistry of Materials, 2013, vol. 25, No. 12, pp. 2455-2462.
Kang et al., "High carrier densities achieved at low voltages in ambipolar PbSe nanocrystals thin-film transistors", Nano Letters 2009, vol. 9, No. 11, pp. 3848-3852.
Hegg et al., "Nanogap quantum dot photodetectors with high sensitivity and bandwidth", Applied Physics Letters, 2010, vol. 96, p. 101118-1-101118-3.
Prins et al., "Fast and Efficient Photodetection in Nanoscale Quantum-Dot Junctions", Nano Letters 2012, vol. 12, pp. 5740-5743.
Willis et al., "Controlling Nanogap Quantum Dot Photoconductivity through Optoelectronic Trap Manipulation", Nano Letters 2009, vol. 9, No. 12, 4191-4197.
Xing et al., "High-Throughput Fabrication of Photoconductors with High Detectivity, Photosensitivity, and Bandwidth", ACS Nano, 2012, vol. 6, No. 6, pp. 5627-5634.
European Search Report, dated Jun. 20, 2014, from the corresponding European patent application No. EP14165507.6.
Mustafa Yorulmaz et al., "Luminescence Quantum Yield of Single Gold Nanorods", Nano Letters, 2012, 12(8), 4385-4391.
J.S. Jie et al., "Photoconductive Characteristics of Single-Crystal CdS Nanoribbons", Nano Letters, 2006, 6(9), 1887-1892.
Kaiqiang Lin et al., "Size Effect on SERS of Gold Nanorods Demonstrated via Single Nanoparticle Spectroscopy", The Journal of Physical Chemistry, 2016, 120(37), 20806-20813.
S. Thota et al., "Structural Defects Induced Peak Splitting in Gold-Copper Bimetallic Nanorods during Growth by Single Particle Spectroscopy", Nanoscale, 2015, 7, 14652-14658.

* cited by examiner

ELECTRONIC DEVICE COMPRISING NANOGAP ELECTRODES AND NANOPARTICLE

FIELD OF INVENTION

The present invention relates to the field of nanotechnology and especially to a device comprising nanogap electrodes and nanoparticles. The present invention also pertains to processes for preparing said device and to applications in photodetection using said device.

BACKGROUND OF INVENTION

The use of colloidal quantum dots (CQD) in optoelectronic devices requests both the fine control of their optical and transport properties. Transport in a CQD film is a multiscale process where hopping process occur at the nanoparticle scale and film morphology (cracks . . . ) is playing a role at the micrometric scale. Consequently not only the inter-particle tunnel barrier needs to be tune to adjust the coupling but a good long scale ordering is also requested. Atomic-ligand passivation (such as $S^{2-}$, $SCN^-$ or $Cl^-$ and metal chalcogenides ligands) do address the shortening and lowering of the inter-particle tunnel barrier but they generally request polar solvent which come at the price of a more limited range of method to build the nanoparticle film. With such passivation the film remains strongly disordered. In disordered film the photo-activated carrier still need to perform a random walk to reach the electrodes which typically included hundred to thousand steps. To avoid this inefficient transport process several strategies have been developed among which the realization of QD-graphene hybrid to uncouple the absorption from the transport process or the use of nanogap.

With a nanometer long channel, capable of accommodating nanoparticles, the nanoparticle can be directly connected to the electrodes which avoid the post absorption diffusion transport of the carrier and its trapping. Moreover the short transport length reduced the transit time which tend to increase the photoconductive gain of the device. To realize these nanogaps several methods have been proposed including e-beam lithography, self-alignment method, electromigration or shadowing methods. In spite of this interest quantum dots remain tricky to connect to the electrodes and a poor overlap is obtained while using a spherical particle which size is of the same order of magnitude of the gap size.

One of the object of the present invention is thus to use nanoplatelets for connecting nanogap electrodes.

Motivation for nanogap based photodetector is first the increase of the gain. In a photodetector the responsivity, i.e. the hability of the active material to convert the light photon flux into a current expressed in $A \cdot W^{-1}$; is proportional to the product of the internal quantum efficiency by the gain R $\pi$ $\eta g$. The gain is itself the ratio of the photo carrier lifetime $\tau$ divided by the transit time $\tau_{transit}$, where the transit time is the time for a photogenerated charge to reach the electrode:

$$g = \frac{\tau}{\tau_{transit}}.$$

The internal quantum efficiency is the ratio of the number of charger carriers collected by the electronic device to the number of photons absorbed by the active material. The smallest the spacing between the electrodes the shortest the time for the carrier to reach the electrodes. As a consequence reducing the electrodes spacing from a few micrometers to a few nanometers potentially increases the gain by a factor 1000.

Other motivation for nanogap based photodetector is the fact that the volume reduction of the nanoparticle makes that it is easier to get rid of the defect of the film morphology. Indeed for micrometer scale film is common to observe crack formation into the film. These cracks in particular tend to be formed when a ligand exchange procedure on film is processed.

Finally another attractive aspect for nanogap based photodetector is the fact that transport is no longer driven by hopping. Consequently the noise level is not as high as the one associated with hopping transport.

Consequently the use of nanoplatelets for connecting nanogap electrodes could lead to outstanding properties, such as responsivity and/or specific detectivity, which have not been reported until now in the prior art.

SUMMARY

This invention thus relates to an electronic device comprising a substrate and at least two electrodes spaced by a nanogap, wherein the at least two electrodes are bridged by at least one nanoparticle and wherein the at least one nanoparticle has an overlap area with the at least two electrodes higher than 2% of the area of the at least one nanoparticle.

According to one embodiment, the at least one nanoparticle has an overlap area with each of the at least two electrodes higher than 1% of the area of the at least one nanoparticle.

According to one embodiment, the nanogap has a size ranging from 0.1 nanometer to 1,000 nanometers, preferably from 1 nanometer to 100 nanometers, more preferably from 10 nanometers to 80 nanometers.

According to one embodiment, the nanogap has a length ranging from 1 nanometer to 10 millimeters, preferably from 5 nanometers to 1 millimeter, more preferably from 10 nanometers to 100 micrometers, even more preferably from 50 nanometers to 10 micrometers.

According to one embodiment, the at least one nanoparticle is a large quantum dot, a nanosheet, a nanorod, a nanoplatelet, a nanoplate, a nanowall, a nanodisk, a nanotube, a nanoribbon, a nanobelt or a nanowire. According to a preferred embodiment, the at least one nanoparticle is a semiconductor nanoplatelet.

According to one embodiment, the electronic device further comprises an electrolyte 124 on the at least one nanoparticle 142.

The present invention also relates to a method of manufacturing the electronic device of the present invention, the method comprising the steps of:

a) formation on a substrate of at least two electrodes spaced by a nanogap ranging from 0.1 nanometer to 1,000 nanometers;

b) preparation of colloidal nanoparticles;

c) nanoparticle's ligand exchange procedure d) deposition of at least one nanoparticle onto the nanogap wherein the at least one nanoparticle has an overlap area with the at least two electrodes spaced by a nanogap higher than 2% of the area of the at least one nanoparticle;

e) nanoparticle's ligand exchange procedure if not performed at step c); and f) optionally deposition of an electrolyte.

According to one embodiment, the method of formation on a substrate of at least two electrodes spaced by a nanogap is selected from electromigration, electrodeposition, mechanically controlled break junctions, e-beam lithography, self-alignment methods, lift-off methods, shadowing methods, on-wire lithography, nanotube masks.

According to one embodiment, the method of deposition of at least one nanoparticle onto the nanogap is selected from drop casting, spin coating, dip coating, spray casting, screen printing, inkjet printing, sputtering techniques, evaporation techniques, electrophoretic deposition, gravure printing, flexographic printing or vacuum methods.

The present invention also relates to an electronic device wherein a pn junction is formed between the at least two electrodes.

According to one embodiment, the electronic device of the present invention is used as photodetector, transistor or phototransistor. According to one embodiment, the electronic device of the present invention is used as optical modulator. According to one embodiment, the electronic device of the present invention is used as an electrical diode, a photovoltaic solar cell or an electroluminescent component.

DEFINITIONS

In the present invention, the following terms have the following meanings:

As used herein the singular forms "a", "an", and "the" include plural reference unless the context clearly dictates otherwise.

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent.

"Active material" refers to the material (usually a semiconductor) which carrier density and or electronic state will be tuned by the application of a bias over the electrodes.

"Aspect ratio" refers generally to the ratio of the lengths in the different dimensions. The aspect ratio of the nanogap refers herein to the ratio of the length of the nanogap (i.e. to the width of the ends of the at least two electrodes spaced by the nanogap) to the distance between the at least two electrodes spaced by the nanogap (also referred herein as the nanogap size).

"Nanogap" refers herein to spacing, at the nanometer scale, between at least two electrodes.

"Nanogap electrodes" refers to at least two electrodes spaced by at least one nanogap. "Nanogap electrodes" and "at least two electrodes spaced by a nanogap" are used interchangeably throughout the specification "Nanogap size" refers herein to the median inter-electrodes distance.

"Nanoparticle" refers to a particle of any shape having at least one dimension in the 0.1 to 100 nanometers range.

"Projected area" of a nanoparticle refers to the area defined by the projection of the surface of the nanoparticle on the plane defined by the surface of the at least two electrodes spaced by a nanogap in contact with the nanoparticle.

DETAILED DESCRIPTION

This invention relates to an electronic device comprising a substrate and at least two electrodes spaced by a nanogap.

According to a preferred embodiment, the at least two electrodes spaced by a nanogap are bridged by at least one nanoparticle and the at least one nanoparticle has an overlap area with the at least two electrodes spaced by a nanogap higher than 5% of the area of the at least one nanoparticle.

The device of the present invention comprises a substrate on which the at least two electrodes spaced by a nanogap are formed, manufactured and/or deposited.

According to a first embodiment, the substrate is formed from silicon, silicon dioxide, aluminum oxide, sapphire, germanium, gallium arsenide, an alloy of silicon and germanium, indium phosphide, indium tin oxide, fluorine doped tin oxide, graphene, glass and its derivative, plastic materials or any material that a person skilled in the art would find suitable.

According to a second embodiment, the substrate is formed from ZnS, ZnSe InP, CdZnTe, ZnTe, GaAs, GaSb, or mixture thereof.

According to an embodiment, the substrate is formed from undoped semiconductor. According to another embodiment, the substrate is formed from slightly doped semiconductor.

According to an embodiment, the substrate is formed from non-conducting polymer.

According to an embodiment, the substrate is formed from an insulating material.

According to a preferred embodiment, the substrate is formed from an oxide material acting as an electronic insulator. According to another embodiment, the substrate comprises at least two layers with an oxide layer on the top, acting as an electronic insulator, such as for example $SiO_2$ layer on a Si layer.

According to an embodiment, the substrate is rigid. According to another embodiment, the substrate is flexible and/or stretchable.

According to an embodiment, the substrate is transparent.

According to an embodiment, the substrate is transparent in a wavelength window compatible with the absorption spectrum of the at least one nanoparticle. Compatible means herein that the substrate is at least partly transparent in the range of wavelength wherein the at least one nanoparticle is absorbing. Partly transparent means herein that the substrate has a transmittance of at least 50%, preferably at least 75%, more preferably at least 90%.

According to an embodiment, the substrate is transparent in the visible, i.e. in a wavelength range from about 380 nanometers to about 750 nanometers.

According to an embodiment, the substrate is transparent in the ultraviolet range of wavelength, i.e. in a wavelength range from about 10 nanometers to about 380 nanometers.

According to an embodiment, the substrate is transparent in the infrared range of wavelength, i.e. in the wavelength range from about 750 nanometers to about 1,000,000 nanometers, preferably from about 750 nanometers to about 50,000 nanometers, more preferably from about 750 nanometers to about 3000 nanometers.

According to one embodiment, the substrate is partly transparent in the visible and/or in the ultraviolet range of wavelength and/or in the infrared range of wavelength.

According to an embodiment, the substrate transparency window is at least 1 nanometer large, preferably at least 10 nanometers large and more preferably above 50 nanometers large.

According to an embodiment, the substrate is transparent in two wavelength windows compatible with the absorption spectrum of the at least one nanoparticle.

According to an embodiment, the substrate transparency window is made of several windows in order to fit the absorption spectrum of the multicolor detector, preferably of several narrow transparency windows i.e. of at most 50 nm large.

According to an embodiment, the substrate is used as back gating. In said embodiment, the substrate is preferentially formed from a conducting contact coated with a dielectric layer, said dielectric contact being formed from silicon dioxide, hafnium dioxide, non-conducting polymer such as PMMA or any other dielectric layer that one skilled in the art would find suitable.

The electronic device of the present invention comprises nanogap electrodes (i.e. at least two electrodes spaced by a nanogap).

According to a first embodiment, the device comprises 2, 3, 4, 5, 6, 7, 8, 9, 10, 11, 12, 13, 14 or 15 electrodes spaced by at least one nanogap.

According to an embodiment, the nanogap is positioned between 2, 3, 4, 5, 6, 7, 8, 9, 10, 11, 12, 13, 14 or 15 electrodes.

According to an embodiment, wherein the device comprises three electrodes, one of them is used as a gate electrode for tuning the carrier density between the two other nanogap electrodes (i.e. in the active material bridging the two other electrodes: the source and the drain electrodes).

According to an embodiment, the device comprises several electrodes (for example 2, 3, 4, 5, 6, 7, 8, 9, 10, 11, 12, 13, 14 or 15 electrodes) forming several nanogaps (for example 1, 2, 3, 4, 5, 6, 7, 8, 9, 10, 11, 12, 13 or 14 nanogaps) in parallel.

According to an embodiment, the device comprises several electrodes (for example 2, 3, 4, 5, 6, 7, 8, 9, 10, 11, 12, 13, 14 or 15 electrodes) forming an array of nanogap.

According to an embodiment, as illustrated in FIG. 2, the nanogap has a straight shape. According to another embodiment, the nanogap has a serpentine shape. According to an embodiment, the geometry of the nanogap comprises curved edges. According to one embodiment, the at least two electrodes spaced by a nanogap are interdigitated.

According to an embodiment, the nanogap has an aspect ratio ranging from 1 to $10^9$, preferably from 10 to $10^6$, more preferably from 100 to $10^5$.

According to an embodiment, the size of the nanogap ranges from 0.1 nanometer to 1,000 nanometers, preferably from 0.1 nanometer to 200 nanometers, more preferably from 0.1 nanometers to 100 nanometers, even more preferably from 0.1 nanometers to 75 nanometers.

According to an embodiment, the size of the nanogap is less than 1,000 nanometers, less than 200 nanometers, preferably less than 100 nanometers, more preferably less than 75 nanometers, even more preferably less than 50 nanometers.

According to one embodiment, the depth of the nanogap ranges from 0.1 nm to 10 μm, preferably from 0.1 nm to 1 μm, more preferably from 1 nm to 100 nm.

According to an embodiment, the length of the nanogap ranges from 1 nanometer to 10 millimeters, preferably from 5 nanometers to 1 millimeter, more preferably from 10 nanometers to 100 micrometers. According to an embodiment, at least one of the nanogap electrodes is not tapered or pointed. According to an embodiment, the nanogap electrodes are not tapered or pointed.

According to an embodiment, the nanogap electrodes are formed from metal such as gold, silver, palladium, platinum, copper, titanium, tungsten, aluminum, silver or iron.

According to an embodiment, the nanogap electrodes are formed form transparent conducting layer made for example from transparent conducting oxides such as indium tin oxide, fluorine doped tin oxide, zinc oxide, doped zinc oxide.

According to an embodiment, the nanogap electrodes are formed from non-doped semiconductor or doped semiconductor such as ZnS, ZnSe InP, CdZnTe, ZnTe, GaSb, Si, Sn, Ge, GaAs, AlGaAs, InAs, InP, InGaAs, or mixture thereof.

According to an embodiment, the nanogap electrodes are formed from carbon based materials. According to an embodiment, the nanogap electrodes are not formed from carbon based materials.

According to an embodiment, the nanogap electrodes are formed from the same material. According to another embodiment, the nanogap electrodes are formed from two different materials.

According to an embodiment, the material forming the at least two electrodes spaced by a nanogap is homogeneous. According to another embodiment, the material forming the at least two electrodes spaced by a nanogap is structured of different layers.

In an embodiment, the nanogap electrodes do not comprise an insulator coating.

The electronic device of the present invention comprises at least two electrodes spaced by a nanogap and bridged by at least one nanoparticle. According to an embodiment, in the device of the present invention each of the at least one nanoparticle bridges at least two electrodes spaced by a nanogap.

According to an embodiment, in the device of the present invention the at least one nanoparticle is used as the active material.

According to an embodiment, the at least one nanoparticle bridging the at least two electrodes spaced by a nanogap has at least 2% of its projected area overlapping with the at least two electrodes spaced by a nanogap (i.e. the at least one nanoparticle has an overlap area with the at least two electrodes spaced by a nanogap higher than 2% of the area of the at least one nanoparticle). According to an embodiment the at least one nanoparticle bridging the at least two electrodes spaced by a nanogap has at least 5% of its projected surface overlapping with the at least two electrodes spaced by a nanogap. According to an embodiment, the at least one nanoparticle bridging the at least two electrodes spaced by a nanogap has at least 10% of its projected surface overlapping with the at least two electrodes spaced by a nanogap. According to an embodiment, the at least one nanoparticle bridging the at least two electrodes spaced by a nanogap has at least 20% of its projected surface overlapping with the at least two electrodes spaced by a nanogap.

According to an embodiment, the at least one nanoparticle bridging the at least two electrodes spaced by a nanogap has at least 1% of its projected area overlapping with each of the at least two electrodes spaced by a nanogap (i.e. the at least one nanoparticle has an overlap area with each of the at least two electrodes spaced by a nanogap higher than 1% of the area of the at least one nanoparticle). According to an embodiment the at least one nanoparticle bridging the at least two electrodes spaced by a nanogap has at least 2.5% of its projected surface overlapping with each of the at least two electrodes spaced by a nanogap. According to an embodiment, the at least one nanoparticle bridging the at least two electrodes spaced by a nanogap has at least 5% of its projected surface overlapping with each of the at least two electrodes spaced by a nanogap. According to an embodiment, the at least one nanoparticle bridging the at least two electrodes spaced by a nanogap has at least 10% of its projected surface overlapping with each of the at least two electrodes spaced by a nanogap.

According to an embodiment, as shown in FIG. 8, the at least one nanoparticle bridging the at least two electrodes spaced by a nanogap is for example nanocrystal, nanosphere, nanocube, nanosheet 104, nanorod 106, nanoplatelet 108, nanoplate 110, nanoprism, nanowall 112, nanodisk 114, nanoparticle, nanopowder, nanotube 144, nanotetrapod, nanotetrahedron, nanoribbon 118, nanobelt 120, nanowire 116, nanoneedle 122, nanocube, nanoball, nanocoil, nanocone, nanopiller, nanoflower, quantum dot or combination thereof.

According to an embodiment, the at least one nanoparticle bridging the at least two electrodes spaced by a nanogap is a large quantum dot 102 (i.e. a quantum dot having a diameter of at least 10 nanometers, at least 15 nanometers, at least 20 nanometers, at least 25 nanometers, at least 30 nanometers, at least 40 nanometers, at least 50 nanometers, at least 75 nanometers, or at least 100 nanometers).

According to an embodiment, the at least one nanoparticle bridging the at least two electrodes spaced by a nanogap has any shape suitable for bridging at least two electrodes spaced by a nanogap, e.g. nanosheet 104, nanorod 106, nanoplatelet 108 (which can be a semiconductor), nanoplate 110, nanowall 112, nanodisk 114, nanowire 116, nanoribbon 118, nanobelt 120, nanoneedle 122 and the like.

According to an embodiment, the at least one nanoparticle is 0D, 1D, and 2D nanoparticle.

In the present application, the term nanoplatelet has the same meaning as nanosheet, 2D-nanoparticle or quasi 2D-nanoparticle.

According to a preferred embodiment, the at least one nanoparticle bridging the at least two electrodes spaced by a nanogap is a nanoplatelet or nanosheet. According to an embodiment, the at least one nanosheet has a thickness of about 0.3 nm to about 10 mm, about 0.3 nm to about 1 mm, about 0.3 nm to about 100 µm, about 0.3 nm to about 10 µm, about 0.3 nm to about 1 µm, about 0.3 nm to about 500 nm, about 0.3 nm to about 250 nm, about 0.3 nm to about 100 nm, about 0.3 nm to about 50 nm, about 0.3 nm to about 25 nm, about 0.3 nm to about 20 nm, about 0.3 nm to about 15 nm, about 0.3 nm to about 10 nm, about 0.3 nm to about 5 nm.

According to an embodiment, the at least one nanosheet has a lateral dimensions (length and/or width) of at least 1.5 times its thickness. According to an embodiment, the lateral dimensions of the at least one nanosheet are at least 2, 2.5, 3, 3.5, 4, 4.5, 5 times larger than its thickness. According to an embodiment, the lateral dimensions of the nanosheet are from at least 0.45 nm to at least 50 mm.

According to an embodiment, the lateral dimensions of the nanosheet are ranging from at least 2 nm to less than 1 m, from 2 nm to 100 mm, from 2 nm to 10 mm, from 2 nm to 1 mm, from 2 nm to 100 µm, from 2 nm to 10 µm, from 2 nm to 1 µm, from 2 nm to 100 nm, from 2 nm to 10 nm.

According to an embodiment, the at least one nanoparticle bridging the at least two electrodes spaced by a nanogap have an homogeneous composition According to an embodiment, as illustrated in FIGS. 1 and 3, several nanoparticles bridge the at least two electrodes spaced by a nanogap (for example 1, 2, 3, 4, 5, 6, 7, 8, 9, 10, $10^2$, $10^3$, $10^4$, $10^5$, $10^6$, $10^7$, $10^{10}$, $10^{15}$, $10^{20}$, $10^{23}$ nanoparticles).

According to an embodiment, a film of nanoparticles, such as a film of nanoplatelets, bridges the at least two electrodes spaced by a nanogap. According to an embodiment, the film of nanoparticle bridging the at least two electrodes spaced by a nanogap has a thickness ranging from 0.1 nm to 100 µm, preferably ranging from 1 nm to 1 µm and more preferably from 2 nm to 200 nm.

According to an embodiment, the active material comprising at least one nanoparticle is implemented into a film of nanoparticles. According to an embodiment, the film of nanoparticles is obtained from colloidal nanoparticles. According to an embodiment, the active material does not comprise a film of nanoparticles.

According to an embodiment, the at least one nanoparticle of the invention is inorganic, colloidal and/or crystalline.

According to an embodiment, the at least one nanoparticle of the invention comprises a semi-conductor from group IV, group IIIA-VA, group IIA-VIA, group IIIA-VIA, group IA-IIIA-VIA, group IIA-VA, group IVA-VIA, group VIB-VIA, group VB-VIA, or group IVB-VIA.

According to an embodiment, the at least one nanoparticle of the invention comprises a material MxEy, wherein
M is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
E is selected from O, S, Se, Te, N, P, As or a mixture thereof; and
x and y are independently a decimal number from 0 to 5, at the condition that when x is 0, y is not 0 and inversely.

According to an embodiment, the material MxEy comprises cationic element M and anionic element E in stoichiometric ratio, said stoichiometric ratio being characterized by values of x and y corresponding to absolute values of mean oxidation number of elements E and M respectively.

According to an embodiment, the at least one nanoparticle of the invention comprises a material MxNyEz, wherein
M is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
N is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
E is selected from O, S, Se, Te, N, P, As or a mixture thereof; and
x, y and z are independently a decimal number from 0 to 5, at the condition that when x is 0, y and z are not 0, when y is 0, x and z are not 0 and when z is 0, x and y are not 0.

According to one embodiment, the at least one nanoparticle of the invention is made of a quaternary compound such as InAlGaAs, ZnAgInSe or GaInAsSb.

According to an embodiment, the at least one nanoparticle comprises a material selected from Si, Ge, Sn, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_3$, $Cd_3P_2$, $Zn_3P_2$, $Cd_3As_2$, $Zn_3As_2$, ZnO, AlN, AlP, AlAs, AlSb, GaN, GaP, GaAs, GaSb, $FeS_2$, $TiO_2$, $Bi_2S_3$, $Bi_2Se_3$, $Bi_2Te_3$, $MoS_2$, $WS_2$, $VO_2$, and alloys and mixtures thereof.

According to a preferred embodiment, the at least one nanoparticle is selected in the group comprising: CdSe, CdTe, CdS, HgTe, PbSe, PbS, PbTe and the core/shell structures such as CdSe/CdS, CdSe/CdZnS, CdSe/ZnS, CdTe/CdS/CdZnS, CdS/ZnS, PbS/CdS, PbSe/CdS.

According to an embodiment, the at least one nanoparticle bridging the at least two electrodes spaced by a nanogap has an alloy—such as HgCdTe—, a gradient, a core shell or core-crown structure.

According to an embodiment, the at least one nanoparticle presents a heterostructure, which means that the at least one nanoparticle of the invention is partially coated by at least one layer of inorganic material.

According to an embodiment, the at least one nanoparticle has a core/shell structure, i.e. the core is totally coated by at least one layer of inorganic material.

According to another embodiment, the at least one nanoparticle comprises a core totally coated by a first layer of inorganic material, said first layer being partially or totally surrounded by at least one further layer of inorganic material.

According to an embodiment, the core and the at least one layer of inorganic material are composed of the same material or are composed of different materials.

According to an embodiment, the core and the at least one layer of inorganic material comprise a semi-conductor from group IV, group IIIA-VA, group IIA-VIA, group IIIA-VIA, group IA-IIIA-VIA, group IIA-VA, group IVA-VIA, group VIB-VIA, group VB-VIA, or group IVB-VIA.

According to an embodiment, the core and the at least one layer of inorganic material comprise a material MxEy, wherein
M is selected from Zn, Cd, Hg, Cu, Ag, Al, Ga, In, Si, Sn, Ge, Pb, Sb, Pd, Fe, Au, Ti, Bi, W, Mo, V or a mixture thereof;
E is selected from O, S, Se, Te, N, P, As or a mixture thereof; and
x and y are independently a decimal number from 0 to 5, at the condition that when x is 0, y is not 0 and inversely.

According to an embodiment, the material MxEy comprises cationic element M and anionic element E in stoichiometric ratio, said stoichiometric ratio being characterized by values of x and y corresponding to absolute values of mean oxidation number of elements E and M respectively.

According to an embodiment, the core and the at least one layer of inorganic material comprise a material MxNyEz, wherein
M is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
N is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
E is selected from O, S, Se, Te, N, P, As or a mixture thereof; and
x, y and z are independently a decimal number from 0 to 5, at the condition that when x is 0, y and z are not 0, when y is 0, x and z are not 0 and when z is 0, x and y are not 0.

According to one embodiment the core and the at least one layer of inorganic material is made of a quaternary compound such as InAlGaAs, ZnAgInSe or GaInAsSb.

According to an embodiment, the core and the at least one layer of inorganic material comprise a material selected from Si, Sn, Ge, Sn, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_3$, $Cd_3P_2$, $Zn_3P_2$, $Cd_3As_2$, $Zn_3As_2$, ZnO, AlN, AlP, AlAs, AlSb, GaN, GaP, GaAs, GaSb, $FeS_2$, $TiO_2$, $Bi_2S_3$, $Bi_2Se_3$, $Bi_2Te_3$, $MoS_2$, $WS_2$, $VO_2$, and alloys and mixtures thereof.

According to an embodiment, the at least one nanoparticle is oriented with respect to the at least two electrodes spaced by a nanogap. According to an embodiment, the at least one nanoparticle is not randomly arranged on the nanogap electrodes. According to an embodiment, the at least one nanoparticle is randomly arranged on the nanogap electrodes.

According to an embodiment, the at least one nanoparticle bridging the at least two electrodes spaced by a nanogap has a size equal to the nanogap size. According to an embodiment, the at least one nanoparticle bridging the at least two electrodes spaced by a nanogap has a size larger than the nanogap size.

According to an embodiment, the at least one nanoparticle bridging the at least two electrodes spaced by a nanogap has a size of at least 10 nm, preferably at least 15 nm, more preferably at least 30 nm. According to an embodiment, the at least one nanoparticle bridging the at least two electrodes spaced by a nanogap has a size ranging from about 0.1 nm to about 1,000 nm, preferably from about 1 nm to about 200 nm, more preferably from about 5 nm to about 100 nm, even more preferably from about 10 nm to about 75 nm.

According to an embodiment, the at least one nanoparticle is further coated by an organic capping, agent, an inorganic capping agent, or mixture thereof. According to an embodiment, the at least one nanoparticle has a surface chemistry made of organic ligand such as for example an alkyl chain connected to a thiol, amine, acid and/or phosphine function.

According to an embodiment, the at least one nanoparticle has a surface chemistry made of ions such as $S^{2-}$, $OH^-$, $HS^-$, $Se^{2-}$, $NH^{2-}$, $Te^{2-}$, $SCN^-$, $Br^-$, $I^-$, $Cd^{2+}$, $NH_4^+$, $Hg^{2+}$, $Cl^-$, $Zn^{2+}$, $Pb^{2+}$, or mixture thereof.

According to an embodiment, the at least one nanoparticle has a surface chemistry made metal chalcogenides.

According to an embodiment, the at least one nanoparticle is not selected from carbon based nanoparticle such as carbon nanotubes (multi-walled or single-walled) or graphene. According to an embodiment, the at least one nanoparticle is not selected from silver nanoparticle. According to an embodiment, the at least one nanoparticle is not selected from silicon nanoparticle. According to an embodiment, the at least one nanoparticle is not selected from aluminum nanoparticles, preferably not selected from aluminum quantum dot. According to an embodiment, the at least one nanoparticle does not comprise a semiconductor selected from group III-V, more preferably the at least one nanoparticle is not selected from GaAs.

According to an embodiment, the at least one nanoplatelet is not prepared by exfoliation of the corresponding layered bulk crystals.

According to an embodiment, the electronic device of the present invention does not comprise a nitrogenous material disposed or coated on the at least one nanoparticle.

According to an embodiment, the electronic device of the present invention does not comprise composite made of semiconductor material and plasmonic nanoparticles.

According to an embodiment, the nanogap accommodates biological or chemical molecules. According to an embodiment, the nanogap does not accommodate biological or chemical molecules.

According to an embodiment, the nanogap does not accommodate at least one nanoparticle; the at least one nanoparticle bridges the at least two electrodes spaced by a nanogap.

According to an embodiment, the at least one nanoparticle is not positioned between the at least two electrodes spaced by a nanogap; the at least one nanoparticle bridges the at least two electrodes spaced by a nanogap.

According to an embodiment, the at least one nanoparticle does not comprise a bridging molecule.

According to an embodiment, the nanoparticles have absorption and/or photoconduction properties in the X ray and/or in the UV and/or in the visible and/or in the infrared.

According to an embodiment, the nanoparticles have absorption and/or photoconduction properties in the near infrared, and/or in the mid infrared and/or in the long wavelength infrared and/or in the far infrared and or in the THz.

According to an embodiment, the nanoparticles have absorption and/or photoconduction properties from about 750 nanometers to about 1,000,000 nanometers, preferably from about 750 nanometers to about 50,000 nanometers, more preferably from about 750 nanometers to about 10000 nanometers.

According to an embodiment, as shown in FIG. 9, the electronic device of the present invention comprises at least one electrolyte 124: electrolyte gating is performed to tune the carrier density of the at least one nanoparticle 142 bridging the at least two electrodes 144 spaced by a nanogap.

According to an embodiment, solid, polymer, gel, ion-gel or liquid electrolytes may be implemented, preferably gel or solid electrolytes.

According to an embodiment, the contact between the electrolyte and the nanogap electrodes is prevented by the active material (i.e. by the at least one nanoparticle). According to an embodiment, the contact between the electrolyte and the first and second electrodes is prevented by the active material (i.e. by the at least one nanoparticle).

According to an embodiment, the electrolyte can be in the form of an aqueous solution of a dissolved ionic chemical compound (or compounds), a non-aqueous solution of a dissolved ionic chemical compound (or compounds), a polymer electrolyte, a gel electrolyte, a solid electrolyte or a molten salt electrolyte.

According to an embodiment, the electrolyte comprises a matrix and ions. According to a preferred embodiment, the electrolyte comprises a polymer matrix.

According to an embodiment, the polymer matrix of the electrolyte comprises polystyrene, poly(N-isopropyl acrylamide), polyethylene glycol, polyethylene, polybutadiene, polyisoprene, polyethylene oxide, polyethyleneimine, polymethylmethacrylate, polyethylacrylate, polyvinylpyrrolidone, polypropylene glycol, polydimethylsiloxane, polyisobutylene, or a blend/multiblocks polymer thereof.

According to an embodiment, the electrolyte comprises ions salts. According to an embodiment, the polymer matrix is doped with ions salts. According to said embodiments, the ions salts is LiCl, LiBr, LiI, LiSCN, LiClO$_4$, KClO$_4$, NaClO$_4$, ZnCl$_3^-$, ZnCl$_4^{2-}$, ZnBr$_2$, LiCF$_3$SO$_3$, LiPF$_6$, LiAsF$_6$, LiN(SO$_2$CF$_3$)$_2$, LiC(SO$_2$CF$_3$)$_2$, LiBF$_4$, NaBPh$_4$, NaCl, NaI, NaBr, NaSCN, KCl, KBr, KI, KSCN, LiN(CF$_3$SO$_2$)$_2$, or mixture thereof.

According to an embodiment, the electrolyte comprises material that contains mobile ions of lithium, sodium, potassium, ammonium, hydrogen, copper, silver or mixture thereof.

According to an embodiment, the electrolyte comprises polymers and/or glasses, including but not limited to PEG, PEO, PVDF, PET, PTFE, FEP, FPA, PVC, polyurethane, polyester, silicone, some epoxies, polypropylene, polyimide, polycarbonate, polyphenylene oxide, polysulfone, calcium magnesium aluminosilicate glasses, E-glass, alumino-borosilicate glass, D-glass, borosilicate glass, silicon dioxide, quartz, fused quartz, silicon nitride, silicon oxynitride, or mixture thereof.

According to an embodiment, the electrolyte comprises ionic liquid. According to an embodiment, the polymer matrix and the ions are replaced by a polymerizable ionic liquid.

According to an embodiment, the at least one nanoparticle surface chemistry is chosen to be a counterion of one of the ions of the electrolyte.

According to an embodiment, the nanoparticle surface chemistry is chosen so that the at least one nanoparticle and the electrolyte can form a redox reaction.

According to an embodiment, at least one ion from the electrolyte can reversibly give one or more electron(s) to the active material (i.e. the at least one nanoparticle) as in redox based reactions.

Examples of pairs of nanoparticle surface chemistry/ion include but is not limited to: OH$^-$/Li$^+$, OH$^-$/Na$^+$, OH$^-$/K$^+$, OH$^-$/NH$_4^+$, OH$^-$/any ammonium ion, OH$^-$/any ionic liquid, O$^{2-}$/Li$^+$, O$^{2-}$/Na$^+$, O$^{2-}$/K$^+$, O$^{2-}$/NH$_4^+$, O$^{2-}$/any ammonium ion, O$^{2-}$/any ionic liquid, HS$^-$/Li$^+$, HS$^-$/Na$^+$, HS$^-$/K$^+$, HS$^-$/NH$_4^+$, HS$^-$/any ammonium ion, HS$^-$/any ionic liquid, SCN$^-$/Li$^+$, SCN$^-$/Na$^+$, SCN$^-$/K$^+$, SCN$^-$/NH$_4^+$, SCN$^-$/any ammonium ion, SCN$^-$/any ionic liquid, NH$_2^-$/Li$^+$, NH$_2^-$/Na$^+$, NH$_2^-$, K$^+$, NH$_2^-$/NH$_4^+$, NH$_2^-$/any ammonium ion, NH$_2^-$/any ionic liquid, S$^{2-}$/Li$^+$, S$^{2-}$/Na$^+$, S$^{2-}$/K$^+$, S$^{2-}$/NH$_4^+$, S$^{2-}$/any ammonium ion, S$^{2-}$/any ionic liquid, Se$^{2-}$/Li$^+$, Se$^{2-}$/Na$^+$, Se$^{2-}$/K$^+$, Se$^{2-}$/NH$_4^+$, Se$^{2-}$/any ammonium ion, Se$^{2-}$/any ionic liquid, Te$^{2-}$/Li$^+$, Te$^{2-}$/Na$^+$, Te$^{2-}$/K$^+$, Te$^{2-}$/NH$_4^+$, Te$^{2-}$/any ammonium ion, Te$^{2-}$/any ionic liquid, Cl$^-$/Li$^+$, Cl$^-$/Na$^+$, Cl$^-$/K$^+$, Cl$^-$/NH$_4^+$, Cl$^-$/any ammonium ion, Cl$^-$/any ionic liquid, Br$^-$/Li$^+$, Br$^-$/Na$^+$, Br$^-$/K$^+$, Br$^-$/NH$_4^+$, Br$^-$/any ammonium ion, Br$^-$/any ionic liquid, I$^-$/Li$^+$, I$^-$/Na$^+$, I$^-$/K$^+$, I$^-$/NH$_4^+$, I$^-$/any ammonium ion, I$^-$/any ionic liquid, Any metal-chalcogenide/Li$^+$, Any metal-chalcogenide/Na$^+$, Any metal-chalcogenide/K$^+$, Any metal-chalcogenide/NH$_4^+$, Any metal-chalcogenide/any ammonium ion, Any metal-chalcogenide/any ionic liquid, Cd$^{2+}$/Cl$^-$, Cd$^{2+}$/Br$^-$, Cd$^{2+}$/I$^-$, Cd$^{2+}$/SO4$^{2-}$, Cd$^{2+}$/ClO$_4^-$, Cd$^{2+}$/BF$_4^-$, Cd$^{2+}$/NO$_3^-$, Cd$^{2+}$/any ionic liquid, Pb$^{2+}$/Cl$^-$, Pb$^{2+}$/Br$^-$, Pb$^{2+}$/I$^-$, Pb$^{2+}$/SO4$^{2-}$, Pb$^{2+}$/ClO$_4^{2-}$, Pb$^{2+}$/BF$_4^{2-}$, Pb$^{2+}$/NO$_3^-$, Pb$^{2+}$/any ionic liquid, Zn$^{2+}$/Cl$^-$, Zn$^{2+}$/Br$^-$, Zn$^{2+}$/I$^-$, Zn$^{2+}$/SO4$^{2-}$, Zn$^{2+}$/ClO$_4^-$, Zn$^{2+}$/BF$_4^-$, Zn$^{2+}$/NO$_3^-$, Zn$^{2+}$/any ionic liquid, Hg$^{2+}$/Cl$^-$, Hg$^{2+}$/Br$^-$, Hg$^{2+}$/I$^-$, Hg$^{2+}$/SO4$^{2-}$, Hg$^{2+}$/ClO$_4^-$, Hg$^{2+}$/BF$_4^-$, Hg$^{2+}$/NO$_3^-$, Hg$^{2+}$/any ionic liquid, NH$_3^+$/Cl$^-$, NH$_3^+$/Br$^-$, NH$_3^+$/I$^-$, NH$_3^+$/SO4$^{2-}$, NH$_3^+$/ClO$_4^-$, NH$_3^+$/BF$_4^-$, NH$_3^+$/NO$_3^-$, NH$_3^+$/any ionic liquid.

According to an embodiment, the electrolyte is transparent in a wavelength window compatible with the absorption spectrum of the at least one nanoparticle. Compatible means herein that the substrate is at least partly transparent in the range of wavelength wherein the at least one nanoparticle is absorbing. Partly transparent means herein that the substrate has a transmittance of at least 50%, preferably at least 75%, more preferably at least 90%.

According to an embodiment, the electrolyte is transparent in the visible, i.e. in a wavelength range from about 380 nanometers to about 750 nanometers.

According to an embodiment, the electrolyte is transparent in the ultraviolet range of wavelength, i.e. in a wavelength range from about 10 nanometers to about 380 nanometers.

According to an embodiment, the electrolyte is transparent in the infrared range of wavelength, i.e. in the wavelength range from about 750 nanometers to about 1,000,000 nanometers, preferably from about 750 nanometers to about 50,000 nanometers, more preferably from about 750 nanometers to about 3000 nanometers.

According to an embodiment, the electrolyte transparency window is at least 1 nm large, preferably at least 10 nm large and more preferably above 50 nm large.

According to one embodiment, the substrate is partly transparent in the visible and/or in the ultraviolet range of wavelength and/or in the infrared range of wavelength.

According to an embodiment, the electrolyte is transparent in two wavelength windows compatible with the absorption spectrum of the at least one plurality of nanoparticle.

According to an embodiment, the electrolyte transparency window is made of several windows in order to fit the absorption spectrum of the multicolor detector, preferably of several narrow transparency windows i.e. of at most 50 nm large.

According to an embodiment, the manufacturing process for preparing the electronic device of the present invention comprises two main steps:
nanogap electrodes fabrication,
deposition of the at least one nanoparticle onto the nanogap and nanoparticle's ligand exchange after or before deposition on the nanogap and
optionally, electrolyte deposition, More precisely, as shown in FIG. 10, the manufacturing process for preparing the electronic device of the present invention comprises:

a) the fabrication of the at least two electrodes 144 spaced by a nanogap onto a substrate, b) the preparation of colloidal nanoparticles 142, b') the nanoparticle's ligand exchange step in solution, c) the deposition of at least one nanoparticle 142 onto the nanogap wherein the at least one nanoparticle 142 has an overlap area with the at least two electrodes 144 spaced by a nanogap higher than 5% of the area of the at least one nanoparticle 142, c') if step b') is not implemented, nanoparticle's ligand exchange step d) optionally, the electrolyte deposition on the active material (i.e. on the at least one nanoparticle 142), and e) optionally, the deposition of a further electrode 144 on the electrolyte.

According to an embodiment, the steps b), b'), c), c') may be implemented more than once with different nanoparticles.

According to an embodiment, as shown in FIG. 10, the at least two electrodes of step a) are at least a source 148 and a drain 146 electrodes and the further electrode of step e) is a gate electrode 150.

According to one embodiment, the at least two electrodes are processed with a gas treatment before step c).

According to one embodiment, the at least two electrodes are treated with molecules such as short-chain alkane thiols to improve the adhesion of the at least one nanoparticle before step c).

According to one embodiment, the at least two electrodes are treated with a coating for passivating the surface of the at least two electrodes before step c).

According to an embodiment, the at least two electrodes are annealed before step c) at a temperature ranging from 100° C. to 1000° C.

According to an embodiment, the component in progress is annealed before step d) at low temperature, typically below 400° C., or below 300° C., or below 200° C., or below 100° C.

According to one embodiment, the at least one nanoparticles bridging the nanogap electrodes is obtained by a process which fuses smaller nanoparticles, such as a chemical process or an annealing step.

According to one embodiment, the nanogap bridged by at least one nanoparticle is exposed to an atomic layer deposition or a chemical bath deposition step.

According to an embodiment, for narrow band gap material, nanoparticle's ligand exchange is performed, after deposition, in the active material comprising at least one nanoparticle or on the nanoparticles in solution prior to the deposition of at least one nanoparticle, preferably, after deposition, in the active material comprising at least one nanoparticle.

According to an embodiment, for wide band gap material nanoparticle's ligand exchange is performed, after deposition, in the active material comprising at least one nanoparticle or on the nanoparticles in solution prior to the deposition of at least one nanoparticle, preferably on the nanoparticles in solution prior to the deposition.

According to an embodiment, nanoparticle's ligand exchange improves the conduction properties of the active material.

According to an embodiment, the method of fabrication of the nanogap electrodes is selected from electromigration, electrodeposition, mechanically controlled break junctions, e-beam lithography methods, self-alignment methods, lift-off methods, shadowing methods, on-wire lithography, nanotube masks.

According to an embodiment, the at least one nanoparticle bridging the at least two electrodes spaced by a nanogap is deposited using conventional deposition techniques, including for example, drop casting, spin coating, dip coating, spray casting, inkjet printing, screen printing, sputtering techniques, evaporation techniques, electrophoretic deposition, vacuum methods, gravure printing, flexographic printing or any other means that a person skilled in the art would find appropriate.

According to an embodiment, the electrolyte is deposited using any printing methods that a person skilled in the art would find appropriate, such as for example spin coating or dip coating, or drop casting.

According to an embodiment, in use, the bias applied between the at least two electrodes spaced by a nanogap is below 100 V, preferably below 10 V, more preferably below 5 V.

According to an embodiment, in use, the current flowing between the at least two electrodes spaced by a nanogap is ranging from 1 fA to 1 A, preferably from 1 pA to 1 mA.

According to an embodiment, the device is operated in air. According to an embodiment, the device is operated under inert atmosphere. According to an embodiment, the device is operated under vacuum.

According to an embodiment, the device is operated at a temperature ranging from 0 K to 400 K, preferably from 4 K to 350 K, more preferably from 77 K to 300 K.

According to an embodiment, using nanogap based electrodes bridged by nanoparticles, especially by nanoplatelets, instead of conventional micrometric spaced electrodes unexpectedly improves the responsivity performance.

According to an embodiment, the electronic device of the present invention has a responsivity ranging from $1\ A \cdot W^{-1}$ to $10^9\ A \cdot W^{-1}$, from $1\ A \cdot W^{-1}$ to $10^8\ A \cdot W^{-1}$, from $1\ A \cdot W^{-1}$ to $10^7\ A \cdot W^{-1}$, from $1\ A \cdot W^{-1}$ to $10^6\ A \cdot W^{-1}$, preferably from $1\ A \cdot W^{-1}$ to $10^5\ A \cdot W^{-1}$, more preferably from $1\ A \cdot W^{-1}$ to $10^4\ A \cdot W^{-1}$, even more preferably from $100\ A \cdot W^{-1}$ to $5,000\ A \cdot W^{-1}$.

According to an embodiment, the electronic device of the present invention has a responsivity of at least $1\ A \cdot W^{-1}$, preferably at least to $20\ A \cdot W^{-1}$, more preferably at least $50\ A \cdot W^{-1}$, even more preferably at least $100\ A \cdot W^{-1}$.

According to an embodiment, the electronic device of the present invention has an electron mobility ranging from $10^{-6}$ cm$^2$V$^{-1}$s$^{-1}$ to $10^4$ cm$^2$v$^{-1}$s$^{-1}$, preferably from $10^{-2}$ cm$^2$v$^{-1}$s$^{-1}$ to $10^3$ cm$^2$v$^{-1}$s$^{-1}$.

According to an embodiment, the electronic device of the present invention has a specific detectivity of at least $10^7$ cm·Hz$^{1/2}$W$^{-1}$ (also called "Jones"), preferably at least $10^{10}$ Jones, more preferably at least $10^{12}$ Jones, even more preferably at least $10^{13}$ Jones.

According to an embodiment, the electronic device of the present invention has a response time smaller than 100 milliseconds, preferably smaller than 10 milliseconds, more preferably smaller than 0.1 milliseconds, even more preferably smaller than 0.01 milliseconds.

According to an embodiment, the device of the present invention can also be attractive for other application than photoconduction: thanks to the small gap it is very easy to apply a very large bias ($10^8$ V·m$^{-1}$ can easily be obtained). This large electric field can be used to obtain Stark effect in the bridging nanoparticle. Indeed under an applied electric field the quantum state tend to be shifted in energy. In particular a shift and a bleach of the optical feature are expected. This effect can be used to build an optical modulator.

According to an embodiment, the electronic device of the present invention is used in biological imaging, photodetectors, photovoltaic devices, transistors, stark modulators, light emission devices, quantum-dot lasers, or solar cells.

According to one embodiment, the electronic device of the invention is an apparatus such as a photodetector 128, a transistor 130, a phototransistor 132, an optical modulator 134, an electrical diode 136, a photovoltaic solar cell 138 or an electroluminescent component 140.

According to an embodiment, several devices (i.e. several nanogaps) are used to build a several pixels detector.

According to an embodiment, are used to build an array of detecting pixel used for instance as a focal plane array.

In one embodiment the gate electrode is grounded and a source and drain bias with different sign is applied.

In one embodiment, the gate electrode is grounded and a pn junction 126 is formed between the drain and source nanogap electrodes.

In one embodiment, a pn junction is formed between two of the nanogap electrodes and this electronic device may be used as a LED or as a photodetector operating in photovoltaic mode.

According to an embodiment, the device used as photodetector is operated in the visible range of wavelength. According to another embodiment, the device used as photodetector is operated in the infrared range of wavelength. According to another embodiment, the device used as photodetector is operated in the ultraviolet range of wavelength. According to another embodiment, the device used as photodetector is operated in the X-ray range of wavelength.

According to an embodiment, the device is used to form a diode. According to an embodiment, the device is used for manufacturing an electrical diode.

According to an embodiment, the device used as a diode is the active element of a photovoltaic solar cell. According to an embodiment, the device is used for manufacturing a photovoltaic solar cell or an electroluminescent component.

According to an embodiment, the device used as a diode is the active element of a light emitting diode.

According to an embodiment, the device used as a light emitting diode is the component of a lighting device.

According to an embodiment, the device used as a light emitting diode is the component of a display.

According to an embodiment, the device is used as transistor. According to an embodiment, the device is used as phototransistor.

According to an embodiment, the device is used as a nonlinear component of an electrical circuit.

According to an embodiment, the device is used as a chemical sensor. According to an embodiment, the chemical sensitivity of the device is obtained by the presence of the detecting element acting as a dopant. According to an embodiment, the device used as a chemical sensor is sensitive to the concentration of a species diluted in a solvent used as electrolyte. According to an embodiment, the device used as a chemical sensor present some selectivity properties related to the surface chemistry of the at least one nanoparticle used to bridge the at least two electrodes spaced by a nanogap.

According to an embodiment, the device is used to obtain electroluminescence from the at least one nanoparticle bridging the at least two electrodes spaced by a nanogap.

According to an embodiment, the device is used to obtain stimulated light emission from the at least one nanoparticle bridging the at least two electrodes spaced by a nanogap.

According to an embodiment, the device is as a gain material of a laser.

It should be understood that the spatial descriptions (e.g., "above", "below", "up", "down", "top", "bottom", "on", "under", etc.) made herein are for purposes of illustration only, and that devices of the present invention can be spatially arranged in any orientation or manner that one skilled in the art could easily implemented.

REFERENCES

Figure 1:
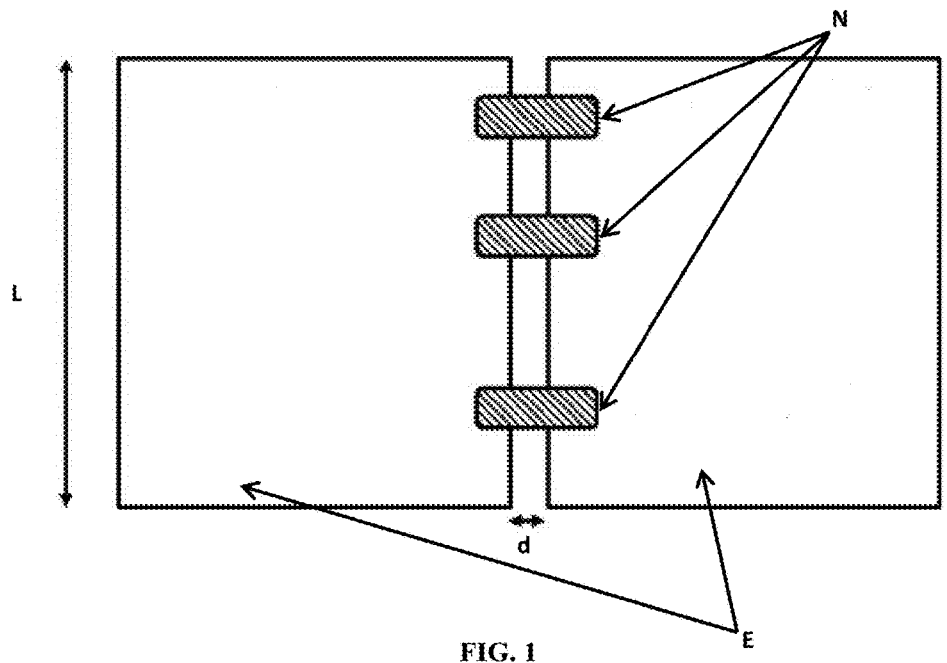
FIG. 1 is a scheme of the electronic device according to one embodiment of the present invention.
Figure 2:
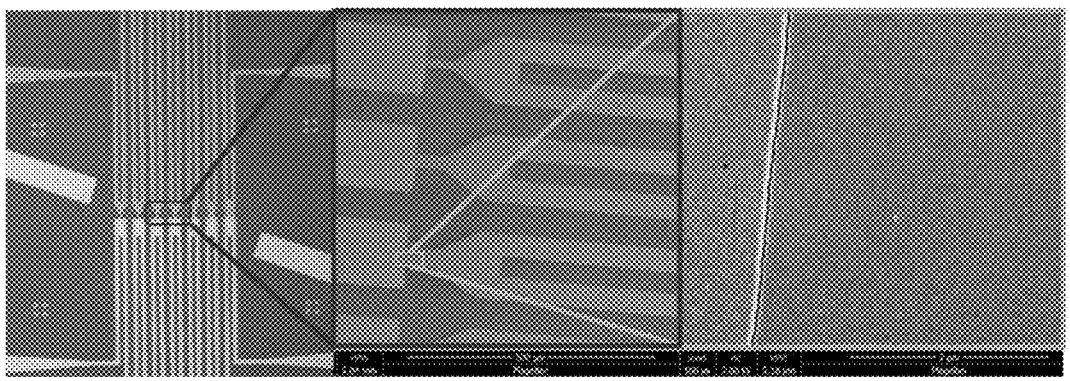
FIG. 2 is a scanning electron microscopy picture of nanogaps at three different scales.
Figure 3:
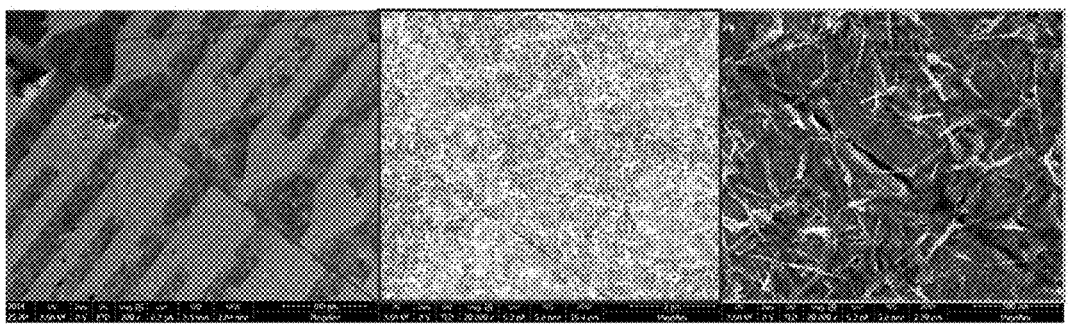
FIG. 3 is a scanning electron microscopy picture of nanogaps coated with CdTe nanoplatelets at three different scales.

N Nanoparticle(s)
E Electrode(s)
d Inter-electrode distance
L Length of the electrode

EXAMPLES

The present invention is further illustrated by the following examples.
Nanoparticle Synthesis:
CdSe Nanoplatelets In a first step Cadmium myristate ($Cd(Myr)_2$) is prepared. In a typical synthesis 240 mg of $Cd(Myr)_2$, 25 mg Se powder are mixed in 30 ml of ODE, the solution degassed under vacuum for 20 minutes at room temperature. Then the atmosphere is switch to Argon and the temperature is set to 240° C. At 204° C. 40 mg of $Cd(OAc)_2$ are quickly added. The reaction is performed 12 minutes at 240° C. After this, the solution is cooled down. The precipitation of the nanoplatelets is done by adding ethanol. After centrifugation the obtained solid is redispersed in hexane. The cleaning procedure is repeated three times.

CdTe Nanoplatelets

In a first step Cadmium propanoate ($Cd(Prop)_2$) is prepared by mixing 1.036 g of CdO in 10 ml of propionic acid under Argon for 1 hour. Then the flask is open to air and the temperature risen to 140° C. up to the point the volume get divided by a factor two. The whitish solution is precipitated by addition of acetone. After centrifugation the solid is dried under vacuum for 24 hours. In the glove box 1M TOPTe is prepared by stirring 2.55 g of Te pellets in 20 ml of TOP for four days at room temperature. In a three necks flask 0.13 g of $Cd(Prop)_2$, 160 μm of oleic acid and 10 ml ODE are degassed for 90 minutes at 95° C. Then the atmosphere is switched to Argon and the temperature risen to 210° C. 0.2 mL of 1M TOPTe is quickly injected in the flask. After 20 minutes the reaction is quenched by adding 1 mL of oleic acid and cooling down the flask at room temperature. The cleaning process is done by adding Ethanol to precipitate the CdTe nanoplatelets. The solid obtained after centrifugation is redispersed in hexane. This procedure is repeated three times.

CdSe/CdS Nanoplatelets

Two procedures can be performed to obtain a CdS shell on CdSe core. In a first procedure 30 mg of NaSH are mixed in 4 ml of N methyl formamide (NMFA) in a 20 mL vial up to dissolution. Then 500 μL of the CdSe core in solution in hexane are added in the vial. The solution is stirred until a complete transfer of the nanoparticles in the NMFA phase. Then 500 μl of 0.2 M cadmium acetate in NMFA are added in the vial. The reaction is performed for 1 hour at room temperature under stirring. Precipitation is ensured by addition of ethanol. After centrifugation the obtained solid is dispersed in NMFA. The cleaning step is repeated a second time. As an alternative procedure to grow the shell it is possible to dissolve 30 mg of $Na_2S$ are mixed in 2 ml of NMFA in a 4 mL vial up to dissolution. The core are then precipitated by addition of acetonitrile to remove the excess of sulfide and redispersed in NMFA. Then 500 μl of 0.2 M cadmium acetate in NMFA are added in the vial. After the almost immediate reaction the excess of precursors is removed by precipitation of the nanocrystals with a mixture of toluene and acetonitrile (5:1). The solid obtained by centrifugation is redissolved in NMFA. The procedure is repeated 3.5 times. The final nanoparticles are stored in NMFA.

Spherical CdSe Quantum Dots

In a three necks flask, 8 ml of ODE, 1.5 g of TOPO and 0.75 ml of $Cd(OA)_2$ at 0.5 M in oleic acid are degassed for 30 minutes under vacuum. Then under argon flow, the temperature is set at 280° C. and a mixture of 3 ml of oleylamine and 4 ml of TOPSe at 1 M in TOP are quickly injected at 300° C. while the temperature is set at 280° C. After 8 minutes, the reaction is stopped and the quantum dots are precipitated twice with ethanol and resuspended in hexane.

PbS Spherical Quantum Dots

In a three necks flask, we introduce 0.9 g lead oxide and 40 mL of oleic acid. The mixture is degassed for 1 h at 100° C. under vacuum and then heated under Argon at 150° C. for three hours. In the glove box 0.4 mL of Bis(trimethylsilyl) sulfide (TMSS) are mixed in 20 mL of octadecene (ODE). In a 100 mL three necks flask, 12 ml of the lead oleate (PbOA) mixture previously prepared are quickly degassed at 100° C. and then heated at 150° C. under Argon. 6 mL of the solution of TMSS in ODE are quickly injected to the flask and the reaction performed for 3 minutes. Finally the solution is quickly cooled to room temperature. The solution is precipitated by adding ethanol and centrifuged for 5 minutes at 3000 rpm. The solid is redispersed in toluene. The cleaning step is repeated a second time. At the third cleaning, selective precipitation is performed to separate the different size.

HgTe Spherical Quantum Dots

In the glove box a 1 M solution of trioctylphosphine telluride (TOPTe) is prepared by a slow stirring of Te powder in trioctylphosphine (TOP). In a three neck flask 135 mg of $HgCl_2$ and 7.4 g of octadecylamine are degassed under vacuum for 1 hour at 120° C. The atmosphere is then switch to Argon and the solution heated at 80° C. 0.5 ml of the 1 M TOPTe are quickly injected and the reaction is performed at the same temperature for 5 minutes. The solution is quenched by a quick addition of dodecanthiol. Finally the flask is cooled down to room temperature. The obtained dark solution is then split between two centrifuge tubes filled with a 10% in volume mixture of dodecanthiol (DDT) in tetrachloroethylene (TCE) and a droplet of TOP. The solution is precipitated by addition of methanol. After centrifugation the solid is dried and redispersed in chloroform. The cleaning is step is repeated three times.

CdS Nanorods

In the glove box, 0.18 g of sulfur powder are stirred in 20 ml of TOP up to dissolution and formation of trioctylphosphine sulfide (TOPS). The final solution is reddish. In a 100 ml three necks flask, 0.23 g of CdO, 0.83 g of n-tetradecyl-phosphonic acid (nTDPA) and 7 g of trioctylphosphine oxide (TOPO) are degassed under vacuum for two hours at 80° C. Then the flask is switch under Argon and the temperature risen up to 340° C. Above 300° C. the solution turns colorless. After 5 minutes the flask is cooled to 300° C., every two minutes 0.4 ml of the TOPS mixture is injected. The color of the solution turn yellowish after 30 minutes and this color will increase up to the end. Once all the TOPS have been injected the heating mantle is removed and the flask quickly cooled down. Around 70° C. some toluene is added to avoid the TOPO solidification. The cleaning process is repeating three times by precipitating the rods by adding ethanol and redispersing them in toluene.

Nanogap Fabrication:

Self-Aligned Method

On a Si/SiO$_2$ wafer, a first electrode is prepared either using standard optical lithography or electron beam lithography. In a typical preparation AZ 5214-E resist is deposit by spin coating on the wafer. The wafer is then baked for 90 s at 110° C. A first UV exposure using the lithography mask is performed for a couple second. Then the film is further bake at 125° C. for 2 minutes. Finally we process to metal deposition. The electrodes are made of a layer of Ti (2 nm), a layer of gold (30 nm) and a layer of Cr (30 nm). Lift off process is then made to remove the resist by dipping the wafer in acetone. The wafer is then cleaned using isopropanol and a plasma O$_2$ etching is conducted for 5 minutes. The electrodes are cooked in air at 250° C. for 30 minutes in order to convert the Cr into chromium oxide. In a second step a second electrodes is prepared using the same lithography method in a geometry which allow an overlap with the first electrode. For metal deposition we evaporate a Ti layer (2 nm) and a gold layer (30 nm). The chromium oxide layer acts as a shadow mask and a nanometer size gap is formed between the two electrodes. After a lift off step and a cleaning step, the top chromium oxide layer of the first electrodes is etched using a chromium etchant solution. A final step of cleaning with acetone and isopropanol is performed.

E-Beam Lithography Method

On a Si/SiO$_2$ wafer, a polymethyl metacrylate polymer is deposited and cooked at 165° C. to remove the excess of solvent. Using electron beam lithography, two electrodes are designed and allows in a second step the evaporation of metals (typically 3 nm of Cr and 30 nm of gold). After a lift off procedure the nanogap is formed.

Tilted Evaporation Method

On a Si/SiO$_2$ wafer, a first electrode is prepared either using standard optical lithography or electron beam lithography. In a typical preparation AZ 5214 E resist is deposit by spin coating on the wafer. The wafer is then baked for 90 s at 110° C. A first UV exposure using the lithography mask is performed for a couple second. Then the film is further bake at 125° C. for 2 minutes. We then process to metal deposition by evaporating Ti (2 nm) and a layer of gold (30 nm). A second pattern is prepared using the same lithography procedure. The second metallic evaporation is made while the sample is tilted in order that the first electrode shadows some part of the second pattern. This shadow effect allows the formation of nanogap at the scale of a few tenth nanometers.

Nanoparticle Depositions for Photodetection—1$^{st}$ Strategy

The nanoparticles initially dispersed in a non-polar solvent can be spincoated onto the nanogap in a glove box. The film is then heated on a hot plate to remove the excess of solvent at 90° C. The device is then dipped into a solution of short ligand such as ethanedithiol ou 1.4 diaminobutane at 1% in ethanol for 1 minute. The film is then rinsed in pure ethanol for 20 s and finally dried under nitrogen flow.

Nanoparticle Depositions for Photodetection—2$^{nd}$ Strategy

The nanoparticles initially dispersed in a non-polar solvent are mixed with a solution of Na$_2$S in N-methyl formamide (1% in weight). After strong sonication the particle switch of phase and are transferred in the polar phase. The initial and now clear non polar phase is discarded. The polar phase is then cleaned two other times by adding hexane. The nanoparticles are precipitated by addition of an alcohol. The obtained pellet is redispersed in fresh N-methyl formamide. This solution is then dropcasted onto the nanogap on a hot plate at 100° C. The heating is performed until a complete removal of the solvent.

Electrolyte Preparation

The electrolyte is a mixture of polyethylene glycol (PEG) or polyethylene oxide (PEO) with a given molar weight and ions. The molar ratio between the cation and the oxygen is taken equal to 16. For a typical electrolyte 50 mg of LiClO$_4$ and 230 mg of PEG (MW=6000 g·mo$^{-1}$) are heated together at 150° C. on a hot plate in the glove box. For higher PEG/PEO molar weight the mixture is heated at 200° C. Processing the electrolyte in air has not lead to any noticeable change. The electrolyte can then be brushed on the at least one nanoparticle onto the nanogap by softening it at 90° C.

Responsivity:

A nanogap where CdSe/CdS nanoplatelets coated with S$^{2-}$ capping ligands have been bridged is characterized at room temperature under primary vacuum. The applied drain source is 2 V. The sample is illuminated using a 405 nm with a power between 1 and 50 mW corresponding to a flux into the nanogap of 1 to 50 nW. The obtained photoresponse is 3 kA·W$^{-1}$.

Pn Junction Formation

HgTe quantum dots are capped using S$^{2-}$ ligands, using a phase transfer method using Na$_2$S precursor dissolved in N-methyl formamide. The nanoparticle solution is dropcasted on nanogap electrodes. Electroltrolyte made of LiClO$_4$ dissolved in PEG (M$_W$=6000 g·mol$^{-1}$) is brushed on the nanoparticle film, while the electrolyte has been soften at 90° C. A gate electrode is deposited on the electrolyte and grounded. A source bias of 2V compared to the gate is applied and a drain bias of −2V compared to the gate is also applied while using a two channel sourcemeter. The whole system is frozen by cooling the system to a temperature below the freezing point of the electrolyte. Then a stable pn junction is formed showing a current-voltage characteristic of a diode.

Measurement Conditions in View of FIGS. 4-7

Figure 4:
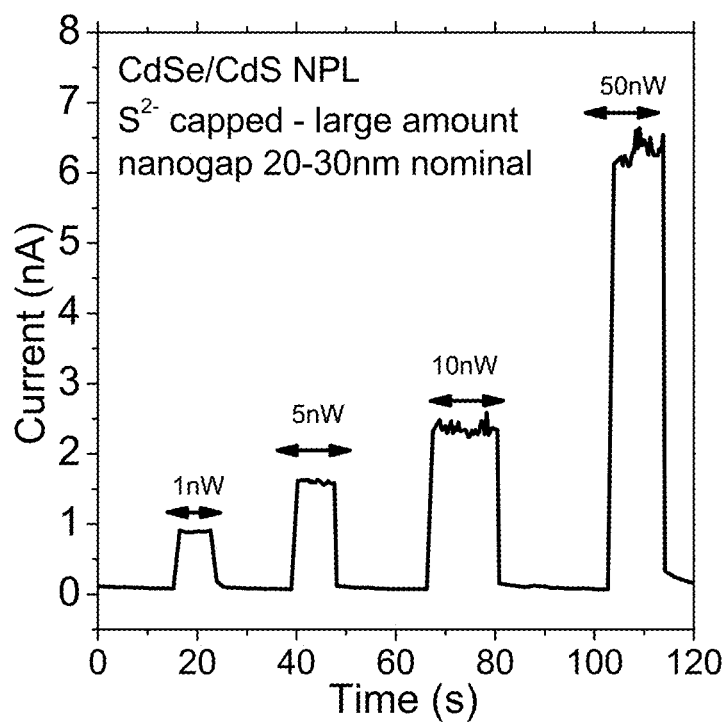
FIG. 4 shows the current as a function of time under a constant drain-source bias in the electronic device according to one embodiment of the present invention wherein the nanogap electrodes are bridged with CdSe/CdS nanoplatelets. The square response corresponds to light illumination. The response time of the electronic device is faster than 0.1 second.
Figure 5:
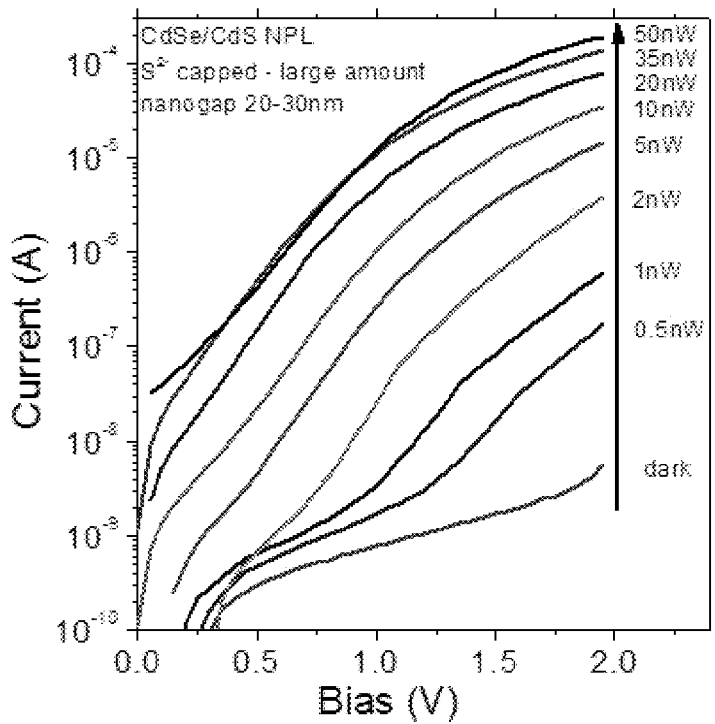
FIG. 5 shows the current as a function of drain bias under incident light power in the electronic device according to one embodiment of the present invention wherein the nanogap electrodes are bridged with CdSe/CdS nanoplatelets.
Figure 6:
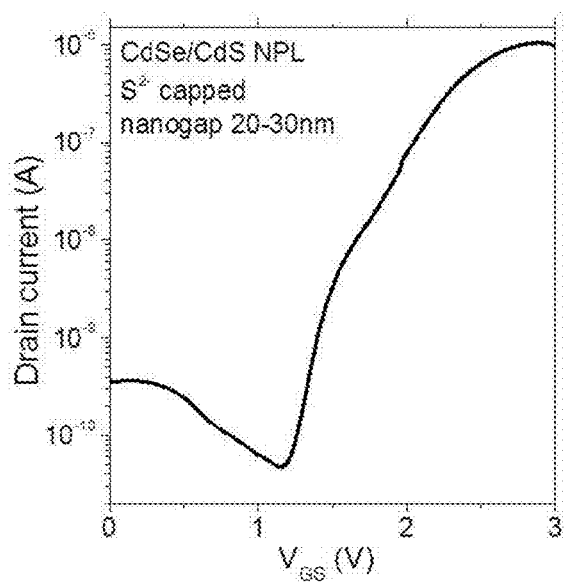
FIG. 6 shows the current as a function of gate bias under incident light power in the electronic device according to one embodiment of the present invention wherein the nanogap electrodes are bridged with CdSe/CdS nanoplatelets. The gating is made by LiClO$_4$ in PEG as electrolyte.
Figure 7:
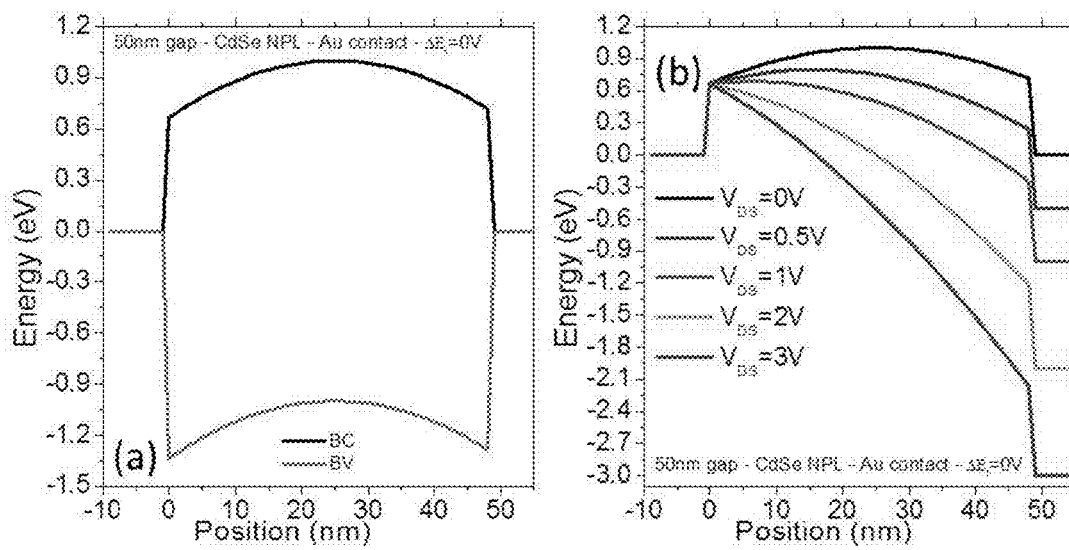
FIG. 7*a* is a scheme of the energy diagram of the electronic device according to one embodiment of the present invention under zero drain bias for conduction and valence band.
FIG. 7*b* is a scheme of the conduction band diagram of the electronic device according to one embodiment of the present invention under different drain bias.
Figure 8:
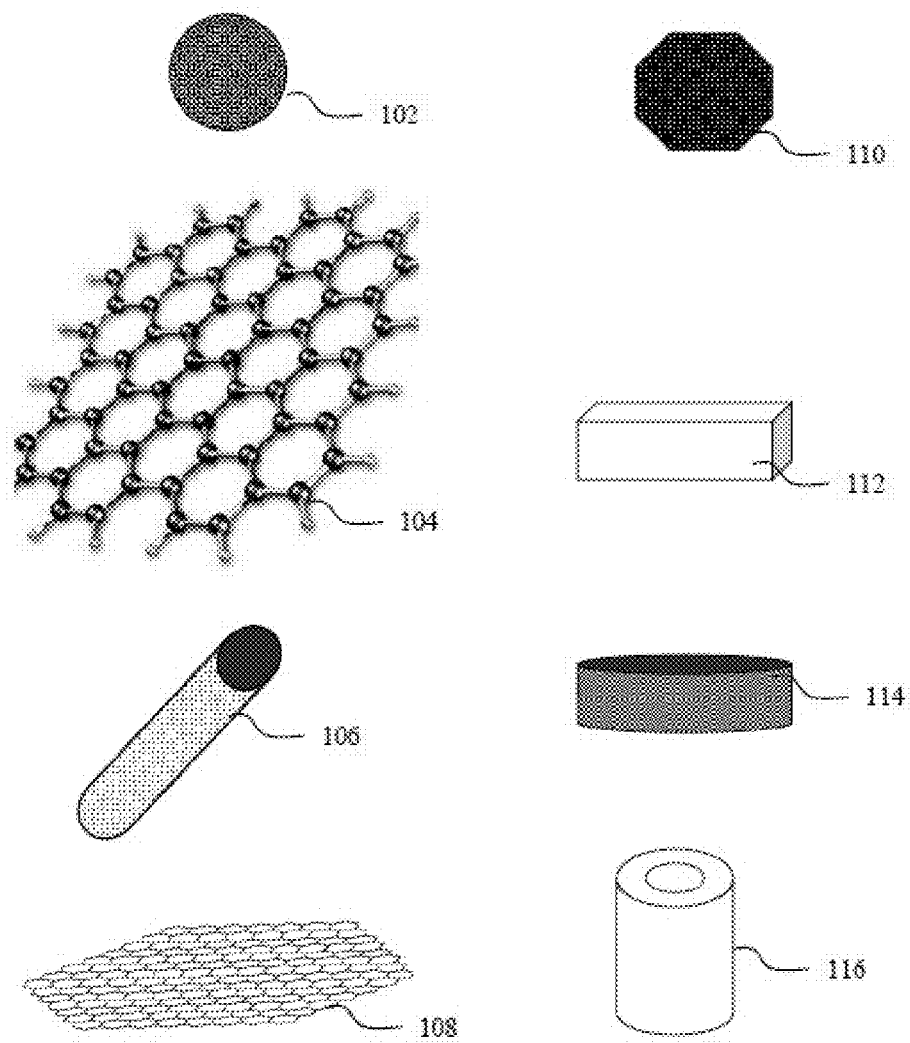
FIG. 8 shows nanostructures of the present invention.
Figure 9:
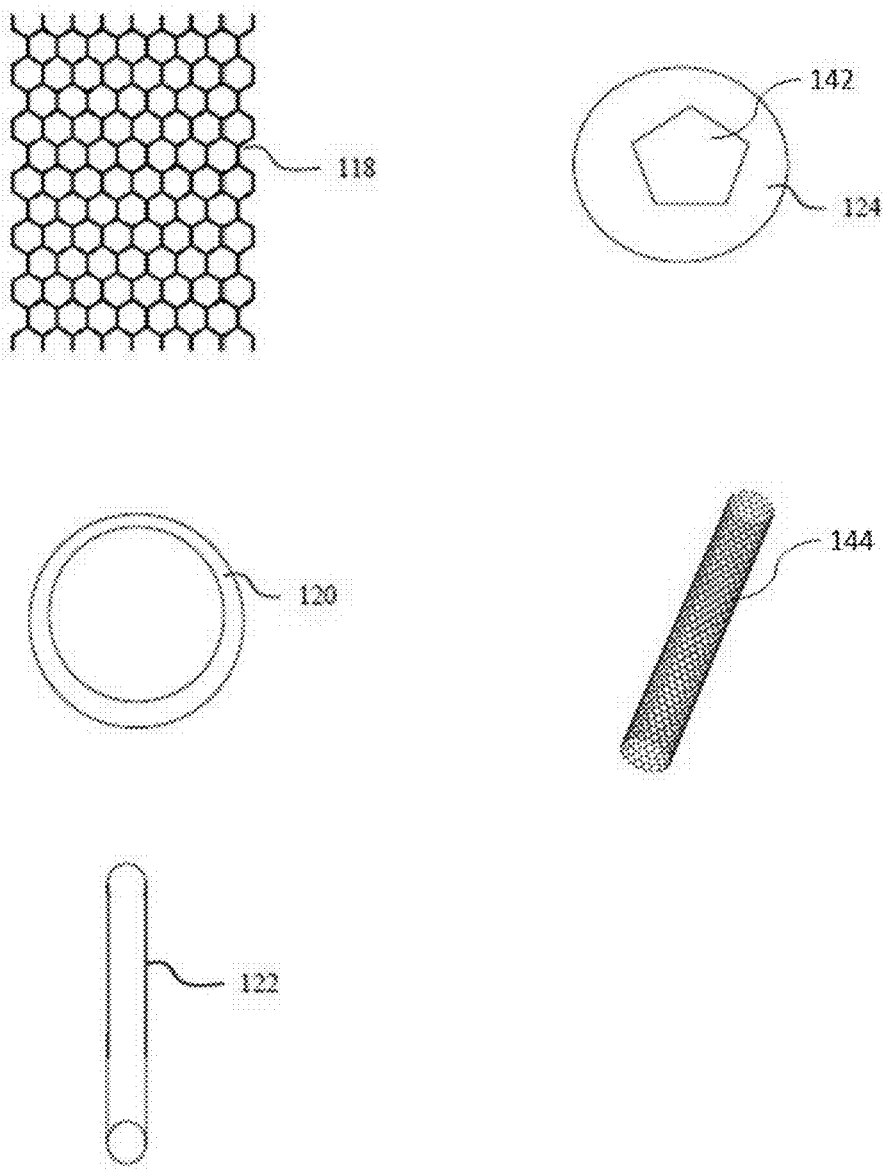
FIG. 9 shows additional nanostructures of the present invention.
Figure 10:
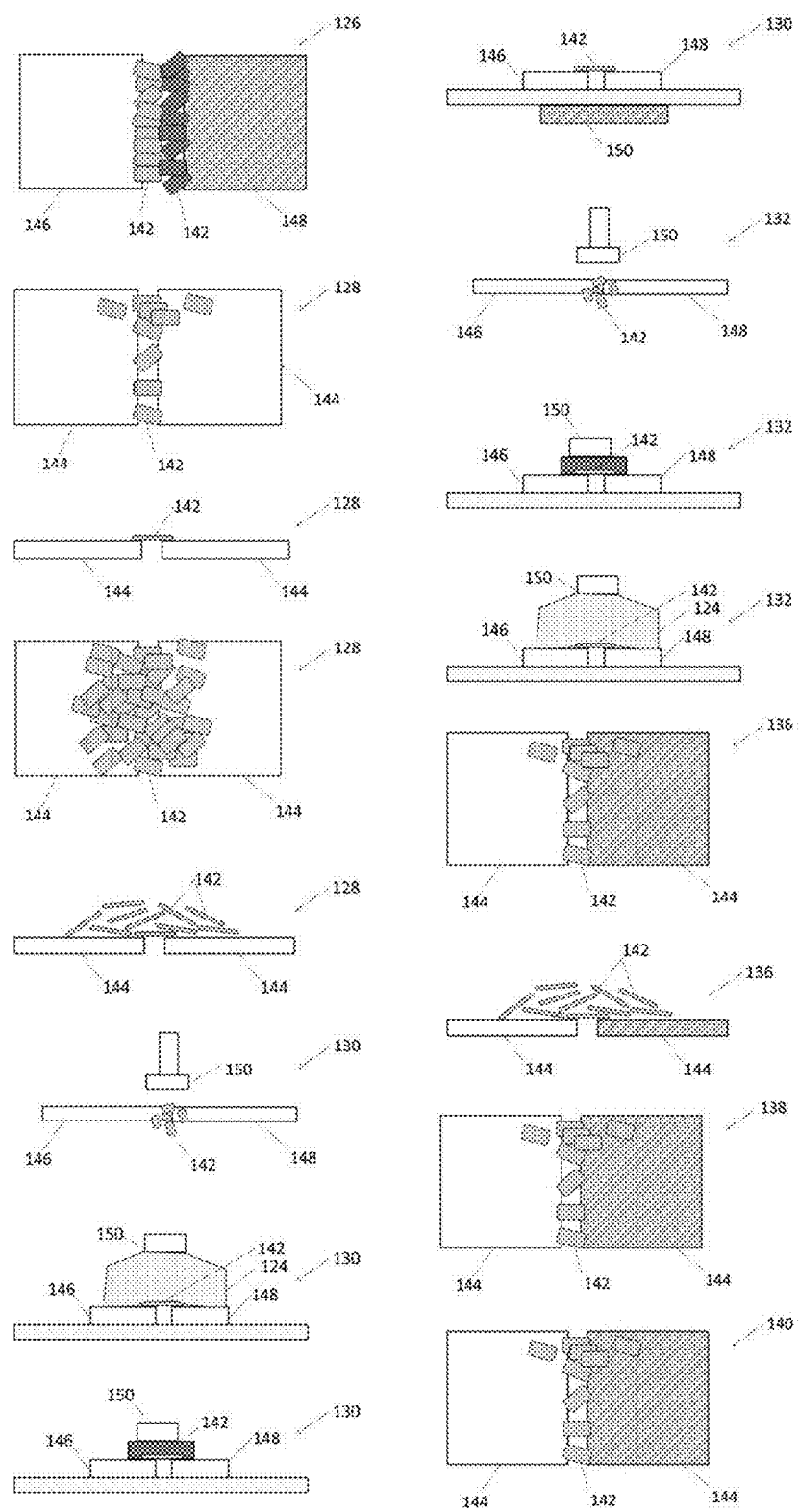
FIG. 10 shows devices formed from the nanostructures of the present invention.

The samples are characterized under vacuum. A drain source bias between 0 and 5 V is 20 applied. Light illumination results from a 405 nm laser source operated with a power ranging from 0.15 mW and 50 mW. All measurements are made at room temperature. FIG. 4 shows the current as a function of time under a constant drain-source bias in the electronic device wherein the nanogap electrodes are bridged with CdSe/CdS nanoplatelets. The square response corresponds to light illumination. The response time of the electronic device is faster than 0.1 second. FIG. 5 shows the current as a function of drain bias under incident light power in the electronic device wherein the nanogap electrodes are bridged with CdSe/CdS nanoplatelets. FIG. 6 shows the current as a function of gate bias under incident light power in the electronic device wherein the nanogap electrodes are bridged with CdSe/CdS nanoplatelets. The gating is made by LiClO4 in PEG as electrolyte. FIG. 7a is a scheme of the energy diagram of the electronic device under zero drain bias for conduction and valence band. FIG. 7b is a scheme of the conduction band diagram of the electronic device under different drain bias.

The invention claimed is:
1. An electronic device comprising:
a substrate; and
at least two electrodes spaced by a nanogap having a size ranging from 0.1 nanometer to less than 1000 nanometers, wherein the at least two electrodes are bridged by at least one nanoparticle, the at least one nanoparticle is not a carbon based nanoparticle and wherein the at least one nanoparticle has an overlap area with the at least two electrodes higher than 2% of the projected surface of the at least one nanoparticle, and each of the at least one nanoparticle is a nanorod, a nanoplatelet, a nanoplate, a nanowall, a nanodisk, a nanotube, a nanoribbon, a nanobelt or a nanowire.

2. The electronic device according to claim 1, wherein the at least one nanoparticle has an overlap area with each of the at least two electrodes higher than 1% of the projected surface of the at least one nanoparticle.

3. The electronic device according to claim 1, wherein the nanogap has a size ranging from 1 nanometer to 100 nanometers.

4. The electronic device according to claim 1, wherein the nanogap has a length ranging from 1 nanometer to 10 millimeters.

5. The electronic device according to claim 1, wherein the at least one nanoplatelet is a semiconductor nanoplatelet.

6. The electronic device according to claim 1, further comprising an electrolyte on the at least one nanoparticle.

7. The electronic device according to claim 1, wherein a pn junction is formed between the at least two electrodes.

8. An apparatus comprising:
an electronic device comprising a substrate and at least two electrodes spaced by a nanogap having a size ranging from 0.1 nanometer to less than 1000 nanometers,
wherein the at least two electrodes are bridged by at least one nanoparticle, the at least one nanoparticle is not a carbon based nanoparticle, the at least one nanoparticle having an overlap area with the at least two electrodes higher than 2% of the projected surface of the at least one nanoparticle,
wherein the apparatus is one of a photodetector comprising the at least two electrodes bridged by the at least one nanoparticle, a transistor comprising the at least two electrodes bridged by the at least one nanoparticle, a phototransistor comprising the at least two electrodes bridged by the at least one nanoparticle, an optical modulator comprising the at least two electrodes bridged by the at least one nanoparticle, an electrical diode comprising the at least two electrodes bridged by the at least one nanoparticle, a photovoltaic solar cell comprising the at least two electrodes bridged by the at least one nanoparticle, and an electroluminescent component comprising the at least two electrodes bridged by the at least one nanoparticle, and
each of the at least one nanoparticle is a nanorod, a nanoplatelet, a nanoplate, a nanowall, a nanodisk, a nanotube, a nanoribbon, a nanobelt or a nanowire.

9. The electronic device according to claim 1, wherein the nanogap has a size ranging from 10 nanometers to 80 nanometers.

10. The electronic device according to claim 1, wherein the nanogap has a length ranging from 5 nanometers to 1 millimeter.

11. The electronic device according to claim 1, wherein the nanogap has a length ranging from 10 nanometers to 100 micrometers.

12. The electronic device according to claim 1, wherein the nanogap has a length ranging from 50 nanometers to 10 micrometers.

13. A method of manufacturing an electronic device according to claim 1, the method comprising the steps of:
a) forming on a substrate at least two electrodes spaced by a nanogap ranging from 0.1 nanometer to less than 1000 nanometers;
b) preparing at least one nanoparticle, each of the at least one nanoparticle being a nanorod, a nanoplatelet, a nanoplate, a nanowall, a nanodisk, a nanotube, a nanoribbon, a nanobelt or a nanowire;
c) optionally causing a nanoparticle ligand exchange procedure to occur;
d) depositing of the at least one nanoparticle onto the nanogap, wherein the at least one nanoparticle is not a carbon based nanoparticle, the at least one nanoparticle having an overlap area with the at least two electrodes spaced by a nanogap higher than 2% of the projected surface of the at least one nanoparticle;
e) causing a nanoparticle ligand exchange procedure to occur if the nanoparticle ligand exchange procedure is not performed at step c); and
f) optionally depositing an electrolyte.

14. The method of manufacturing an electronic device according to claim 13, wherein forming the at least two electrodes on the substrate spaced by a nanogap is selected from electromigration, electrodeposition, mechanically controlled break junctions, e-beam lithography, self-alignment methods, lift-off methods, shadowing methods, on-wire lithography, and nanotube masks.

15. The method of manufacturing an electronic device according to claim 13, wherein depositing the at least one nanoparticle onto the nanogap is selected from drop casting, spin coating, dip coating, spray casting, screen printing, inkjet printing, sputtering techniques, evaporation techniques, electrophoretic deposition, gravure printing, flexographic printing, and vacuum methods.

16. The method of manufacturing an electronic device according to claim 13, wherein the at least one nanoparticle is a semiconductor nanoplatelet.

* * * * *